(12) United States Patent
Randolph et al.

(10) Patent No.: US 7,283,402 B2
(45) Date of Patent: Oct. 16, 2007

(54) METHODS AND SYSTEMS FOR HIGH WRITE PERFORMANCE IN MULTI-BIT FLASH MEMORY DEVICES

(75) Inventors: Mark Randolph, San Jose, CA (US); Darlene Hamilton, San Jose, CA (US); Roni Kornitz, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/653,655

(22) Filed: Jan. 16, 2007

(65) Prior Publication Data

US 2007/0115730 A1    May 24, 2007

Related U.S. Application Data

(62) Division of application No. 11/037,477, filed on Jan. 18, 2005, now Pat. No. 7,206,224.

(60) Provisional application No. 60/563,046, filed on Apr. 16, 2004.

(51) Int. Cl.
*G11C 11/34* (2006.01)
(52) U.S. Cl. .............................. 365/185.29; 365/185.03
(58) Field of Classification Search ........... 365/185.29, 365/185.03
See application file for complete search history.

(56) References Cited

U.S. PATENT DOCUMENTS

| | | |
|---|---|---|
| 5,717,635 A | 2/1998 | Akatsu |
| 5,978,307 A * | 11/1999 | Proebsting et al. .... 365/230.05 |
| 6,331,951 B1 | 12/2001 | Bautista, Jr. et al. |
| 6,381,670 B1 | 4/2002 | Lee et al. |

(Continued)

FOREIGN PATENT DOCUMENTS

WO    WO 98/28745 A1    7/1998

OTHER PUBLICATIONS

International Search Report, Int'l Application No. PCT/US2005/004552, Int'l Filing Date Feb. 11, 2005, 2 pgs.

*Primary Examiner*—Tuan T. Nguyen
(74) *Attorney, Agent, or Firm*—Eschweiler & Associates, LLC

(57) ABSTRACT

Methods and circuits for performing high speed write (programming) operations in a dual-bit flash memory array. The method includes, for example, erasing a first and second bit of each cell in the array to a first state, programming the first bit of each cell in the array to a second state, and subsequently programming the second bit of one or more cells in the array to one of the first and second state according to the user's data, resulting in fast write (programming) of those second bits. In addition, the circuit includes, for example, a core cell array having dual-bit flash memory cells configured into a plurality of array portions. The circuit further includes a control circuit configured to selectively block erase one of the array portions, wherein in a first phase of the block erase both first and second bit locations of each dual-bit flash memory cell in the one array portion have sufficient charge removed therefrom to achieve a first state. The control circuit is further configured to, in a second phase of the block erase, supply charge to the first bit location of each dual-bit flash memory cell of the one array portion to enable subsequently fast-write of user's data to the second bit location.

8 Claims, 8 Drawing Sheets

U.S. PATENT DOCUMENTS

| | | |
|---|---|---|
| 6,519,180 B2 * | 2/2003 | Tran et al. ............. 365/185.03 |
| 6,636,439 B1 | 10/2003 | Ogura et al. |
| 6,683,810 B2 | 1/2004 | Sakamoto |
| 6,686,632 B2 | 2/2004 | Ogura et al. |
| 6,778,445 B2 | 8/2004 | Ooishi et al. |
| 7,054,193 B1 | 5/2006 | Wong |
| 7,120,063 B1 | 10/2006 | Liu et al. |
| 7,139,192 B1 * | 11/2006 | Wong ................... 365/185.03 |
| 2004/0027858 A1 | 2/2004 | Takahashi et al. |

* cited by examiner

METHODS AND SYSTEMS FOR HIGH WRITE PERFORMANCE IN MULTI-BIT FLASH MEMORY DEVICES

REFERENCE TO RELATED APPLICATION

This application is a divisional application of U.S. patent application Ser. No. 11/037,477 which was filed Jan. 18, 2005, now U.S. Pat No. 7,206,224 entitled METHODS AND SYSTEMS FOR HIGH WRITE PERFORMANCE IN MULTI-BIT FLASH MEMORY DEVICES that claims the benefit of U.S. Provisional Patent Application Ser. No. 60/563,046 which was filed Apr. 16, 2004, entitled METHODS AND SYSTEMS FOR HIGH WRITE PERFORMANCE IN MULTI-BIT FLASH MEMORY DEVICES.

FIELD OF INVENTION

The invention is generally related to the field of memory devices and more particularly to methods and systems for high speed programming in multi-bit flash memory devices.

BACKGROUND OF THE INVENTION

Flash and other types of electronic memory devices are constructed of memory cells that individually store and provide access to data. A first generation type memory cell stores a single binary piece of information referred to as a bit, which has one of two possible states. The cells are commonly organized into multiple cell units such as bytes which comprise eight cells, and words which may include sixteen or more such cells, usually configured in multiples of eight. Storage of data in such memory device architectures is performed by writing to a particular set of memory cells, sometimes referred to as programming the cells, where the data can then be retrieved in a read operation. In addition to programming (sometimes referred to as write) and read operations, groups of cells in a memory device may be erased, wherein each cell in the group is set to a known initial state (e.g., a one "1").

The individual memory cells typically comprise a semiconductor structure adapted for storing a bit of data. For instance, many conventional memory cells include a metal oxide semiconductor (MOS) device in which a binary piece of information may be retained. The erase, program, and read operations are commonly performed by application of appropriate voltages to specific terminals of the cell MOS device. In an erase or program operation the voltages are applied so as to cause a charge to be stored in or removed from the memory cell. In a read operation, appropriate voltages are applied to cause a current to flow in the cell, wherein the amount of such current is indicative of the value of the data stored in the cell. The memory device includes appropriate circuitry to sense the resulting cell current in order to determine the data stored therein, which is then provided to data bus terminals of the device for access by other devices in a system in which the memory device is employed.

Flash memory is a non-volatile type of memory which can be modified and hold its content without power. Conventional single-bit flash memories are constructed in a cell structure wherein a single bit of information is stored in each flash memory cell. Each such flash memory cell includes a transistor structure having a source, a drain, and a channel in a substrate or doped well, as well as a gate storage structure overlying the channel. The gate storage structure may include dielectric layers formed on the surface of the doped well. The dielectric layer is often a multilayer insulator such as an oxide-nitride-oxide (ONO) layer having two oxide layers sandwiching a nitride layer.

Multi-bit flash memory has recently been developed, in which each cell can store two or more physical data bits. Dual-bit memory cells are generally symmetrical, wherein the drain and source terminals are interchangeable. When appropriate voltages are applied to the gate, drain, and source terminals, one of the two bits may be accessed (e.g., for read, program, erase, verify, or other operations). When another set of terminal voltages are applied to the dual-bit cell, the other of the two bits may be accessed.

A typical dual-bit flash memory cell may be programmed by applying a relatively high voltage to the gate and a moderately high voltage to the drain, in order to produce "hot" (high energy) electrons in the channel near the drain. The hot electrons accelerate across the bottom dielectric layer into the charge trapping regions such as a nitride, and become trapped in the charge trapping layer. As a result of the trapped electrons, a threshold voltage of the memory cell increases. This change in the threshold voltage (and thereby the channel conductance) of the memory cell created by the trapped electrons is what causes the memory cell to be programmed. To read the memory cell, a predetermined gate voltage greater than the threshold voltage of an un-programmed or erased memory cell, but less than the threshold voltage of a programmed memory cell, is applied to the gate. If the memory cell conducts (e.g., a sensed current in the cell exceeds a minimum value), then the memory cell has not been programmed (the memory cell is therefore at a first logic state, e.g., a one "1"). If, however, the memory cell does not conduct (e.g., the current through the cell does not exceed a threshold value), then the memory cell has been programmed (the memory cell is therefore at a second logic state, e.g., a zero "0"). Thus, each memory cell may be read in order to determine whether it has been programmed, thereby identifying the logic state of the data in the memory cell.

Flash memory cells are organized into individually addressable units or groups such as bytes, words, pages, or blocks (sometimes referred to as sectors) which are accessed for read, program, or erase operations through decoding circuitry, whereby such operations may be performed on the cells within a specific memory location. The memory device includes appropriate decoding and group selection circuitry to address or decode such bytes, words, pages, or blocks, as well as circuitry to provide voltages to the cells being operated on in order to achieve the desired operation.

The flash memory cells, whether single bit or multiple-bit, may be interconnected in a variety of different configurations. For instance, cells may be configured in a NOR configuration, with the control gates of the cells in a row individually connected to a word line and the drains of the cells in a particular column are connected together by a conductive bit line, while all the flash cells in the array have their source terminals connected to adjacent bitlines, or to a common source terminal. In operation, individual flash cells in such a NOR configuration are addressed via the respective word line and bit line using peripheral decoder and control circuitry for programming (writing), reading, erasing, or other functions.

Another cell configuration is known as a virtual ground architecture, in which the control gates of the core cells in a row are tied to a common word line. A typical virtual ground architecture comprises rows of flash memory core cell pairs with a drain or source of one cell transistor connected to an associated bit line. An individual flash cell is selected via the word line and a pair of bit lines bounding the associated cell. A cell may be read by applying voltages to the control gate (e.g., via the common word line) and to a bit line connected to the drain, while the source is connected to ground (Vss) via another bit line. A virtual ground is thus formed by selectively grounding the bit line associated with the source of the cells that are to be read. Where the core cells are of a dual-bit type, the above connections can be used to read a first bit of the cell, whereas the other bit may be similarly read by grounding the bit line connected to the drain, and applying a voltage to the source terminal via the other bit line, thereby effectively interchanging the source and drain regions.

Yet another cell configuration is known as a NAND architecture, in which the core cells are coupled together in series along a common bit line row. A typical NAND architecture comprises rows of series connected flash memory core cells forming bit lines, wherein each of the cells in each row are connected to its own respective word line. Each bit line is selectively coupled to bit line voltages (e.g., a drain and source voltage for various operations) through select gate transistors located at the top and bottom of the rows, respectively. An individual flash cell is selected via the word line and coupling of a selected bit line to the drain and source voltages via the select gate transistors. A cell may be read by applying a read voltage to the control gate (e.g., via the selected word line) while activating all the other word lines along the bit line with a high voltage, while the drain and source terminals are effectively coupled to a drain bias and ground (Vss) via the select gate transistors since the remaining cells along the bit line are turned on. Where the core cells are of a dual-bit type, the above connections can be used to read a first bit of the cell, whereas the other bit may be similarly read by grounding the bit line connected to the drain, and applying a voltage to the source terminal via the other bit line (e.g., effectively swapping the source and drain terminals).

Flash memory devices have various performance characteristics that may vary based on the flash memory architecture. For example, NOR flash has relatively long erase and write times, but have a full address/data interface that allows random access to any location. This feature makes the NOR architecture suitable for storage of program code that will be updated infrequently, for example, for use in cellular phones, digital cameras or personal digital assistants (PDAs). Alternatively, NAND flash has relatively faster erase and write times and has a higher core cell packing density than NOR, however, its I/O interface generally allows for sequential data access. Consequently, NAND flash is often employed in mass storage type devices such as removable flash cards, USB flash drives and solid state disks.

In any event, it is often desirable to improve the speed at which flash memory devices are read or programmed. For example, presently the speed at which flash memory is programmed is somewhat limited, thereby limiting the use of flash memory devices in applications requiring high-speed programming. In such instances, applications typically employ other memory media such as a DRAM as a temporary fast storage before copying the data into non-volatile storage such as the flash memory. Accordingly, improved write performance is desirable for flash memory devices to, inter alia, eliminate the use of other storage media in applications desiring high programming performance and non-volatile storage.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, the primary purpose of this summary is to present some concepts of the invention in a simplified form as a prelude to the more detailed description that is presented later.

In accordance with one aspect of the invention, a method of programming one or more dual-bit flash memory cells is provided. The method comprises erasing first and second bits of each cell within a portion of the array to a first or an initial state, and then programming the first bit of each dual-bit cell in the array portion to a second state. The method further comprises subsequently programming the second bit of one or more of the cells in the array portion to one of the first and second state based on data input by a user. In the above method, the first bit of each dual-bit cell is not employed for user's data retention, but instead is used to positively impact the write speed (make faster) of the corresponding second bit associated therewith during subsequent programming operations. In the above instance, either of the first or second bit locations can be interchanged as the "don't care" bit location, with fast programming effectuated with the other bit location within the cell. Although reducing user's data retention density, the above method has been found to provide improved programming speeds by about 4 times or more over conventional programming of the 2 bits in dual-bit flash, or the single bit of NAND flash.

In accordance with another aspect of the present invention, a method of erasing dual-bit flash memory cells comprises removing charge from first and second bit locations of each cell within a predetermined portion of a flash memory array. In one example, the amount of charge removed from the first and second bit locations is sufficient to force each of the bits to a first state. The method further comprises applying charge to the first bit location of each of the dual-bit cells within the predetermined portion of the array. Subsequently, a programming operation is performed, wherein the second bit locations of one or more dual-bits cells within the predetermined portion of the array are programmed to one of the two possible states, based on data input by a user. Again, swapping the first and second bit locations as the "don't care" bit location for each cell in the array portion is contemplated by the present invention. The application of charge to the first bit locations, in the present example, increases substantially the speed at which user's data may be subsequently written to the second bit locations associated with such cells. In one example, any amount of charge is supplied to the first bit locations, while in another example the charge supplied thereto is sufficient to change the first un-programmed bit locations to a second (programmed) state. In one example, applying charge to one of the bits in the cells is done during the embedded erase (or pre-condition) process, to enable a fast write of user's data in the other bit of the cells later on.

In still another aspect of the present invention, a method of partitioning a dual-bit flash memory array is provided. The method comprises identifying an array portion of the overall array for fast write operations directed thereto. Upon such identification, fast write operations are directed to the identified array portion, wherein the fast write operations differ from the operations performed on portions of the array not so designated (that will be programmed at standard speed). In one example, the fast write operations differ from the standard write operations in a block erase (or precondition) procedure, wherein both first and second bit locations for each cell in the identified array portion are erased by the sufficient removal of charge therefrom. In addition, charge is then supplied to the first bit location for each cell within the identified array portion, thereby providing for subsequent fast programming operations to the second bit locations to one or more cells therein. The fast-write blocks do not necessarily have to be continuous: any block of the flash can be dynamically set as a normal speed or high-speed block.

In accordance with yet another aspect of the present invention, the identification of particular array portions for fast write operations may be user controlled and thus allow for flexible partitioning thereof. In one example, a command register is loaded with user-controlled values indicative of whether particular array portions are designated as fast array or normal array portions. The method further comprises accessing the command register or sending an inquiry command at locations associated with corresponding array portions to determine from the data thereat whether such array portion is a fast write array portion, and executing a fast write sector erase, page write, or page read operation if such a determination is made.

The invention further comprises setting a "fast write mode", followed by any operation related to the fast write mode, and resetting to a "normal mode", followed by any operation related to the normal mode. The method may further inquire the current device mode (fast-write or normal) by sending a mode inquiry command and reading the status from the status register.

The present invention is also directed to a dual-bit memory comprising a core cell array of dual-bit flash memory cells configured into a plurality of array portions (e.g., sectors). The memory further comprises a control circuit configured to partition the plurality of array portions into one of a fast write array portion and a normal write array portion (wherein both portions are not necessarily continuous). In addition, in one example, the control circuit further comprises fast write control logic configured to perform a fast write block erase operation on designated fast write array portions partitioned in the array. The fast write control logic is, for example, configured to block erase both first and second bit locations of each dual-bit cell in the fast array portion by removing charge therefrom. The control logic is further configured to supply charge to the first bit location of each cell in the fast array portion to thereby facilitate fast write operations subsequently to the second bit locations of any cell within the fast write array portion.

In another aspect of the present invention, a dual-bit flash memory comprises a core cell array of dual-bit flash memory cells configured into a plurality of array portions such as memory sectors. The memory further comprises a control circuit adapted to selectively block erase one of the array portions designated for fast write operations in two phases, wherein a first phase comprises block erasing both first and second bit locations of each cell therein to a first state. The control circuit is further adapted, in a second phase, to supply charge to the first bit location of each of the block erased cells. In one example, the charge supplied thereto is sufficient to render the first bit location to be read as a second state. Subsequently, the fast write array portion may have user's data programmed to the second bit locations of one or more cells therein at a rate substantially faster than conventional memory architectures.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
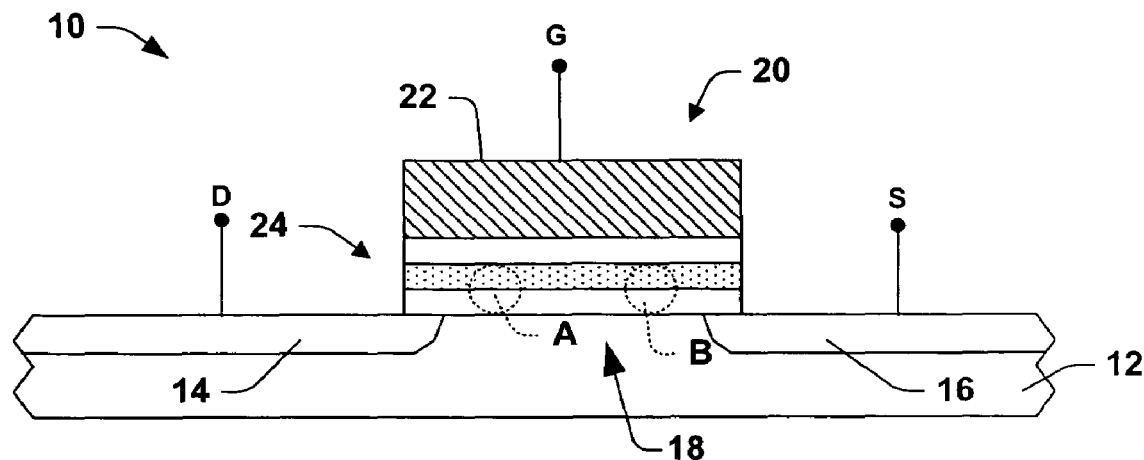
FIG. 1 is a fragmentary cross section diagram illustrating an example of a dual-bit flash memory cell configured to store two physical data bits.

One or more implementations of the present invention will now be described with reference to the drawings, wherein like reference numerals are used to refer to like elements throughout. One or more aspects of the invention are hereinafter illustrated and described in the context of an exemplary dual-bit flash memory device in which conductive doped polysilicon word lines are formed above a charge trapping layer to create flash memory cells in combination with diffused bit line portions (e.g., source/drains) in an underlying silicon semiconductor body, with the cells organized along rows (e.g., word lines) and columns (e.g., bit lines) in a virtual ground array. However, the invention is not limited to the illustrated implementations and may alternatively be employed in connection with any specific type of substrate materials (e.g., silicon wafer, SOI wafer, epitaxial layer, etc.), any type of dual-bit flash memory cell structure, and any array configuration (e.g., NOR, virtual ground, etc.).

An exemplary dual-bit flash memory cell that may be employed in conjunction with the present invention is illustrated in FIG. 1, and designated at reference numeral 10. The dual-bit cell 10 resides within a semiconductor body 12 such as a doped substrate or doped well region within a substrate. Source/drain regions 14 and 16 are separated by a channel region 18 over which a gate structure 20 is formed. The gate structure 20 in the present example comprises a doped polysilicon gate 22 overlying a charge trapping dielectric 24 such as an ONO (oxide-nitride-oxide) layer. Upon appropriate biasing of the source/drain regions 14, 16 and the gate 22 (as will be discussed in greater detail infra), charge can be supplied to or removed from two distinct bit locations labeled A and B in FIG. 1.

Figure 2:
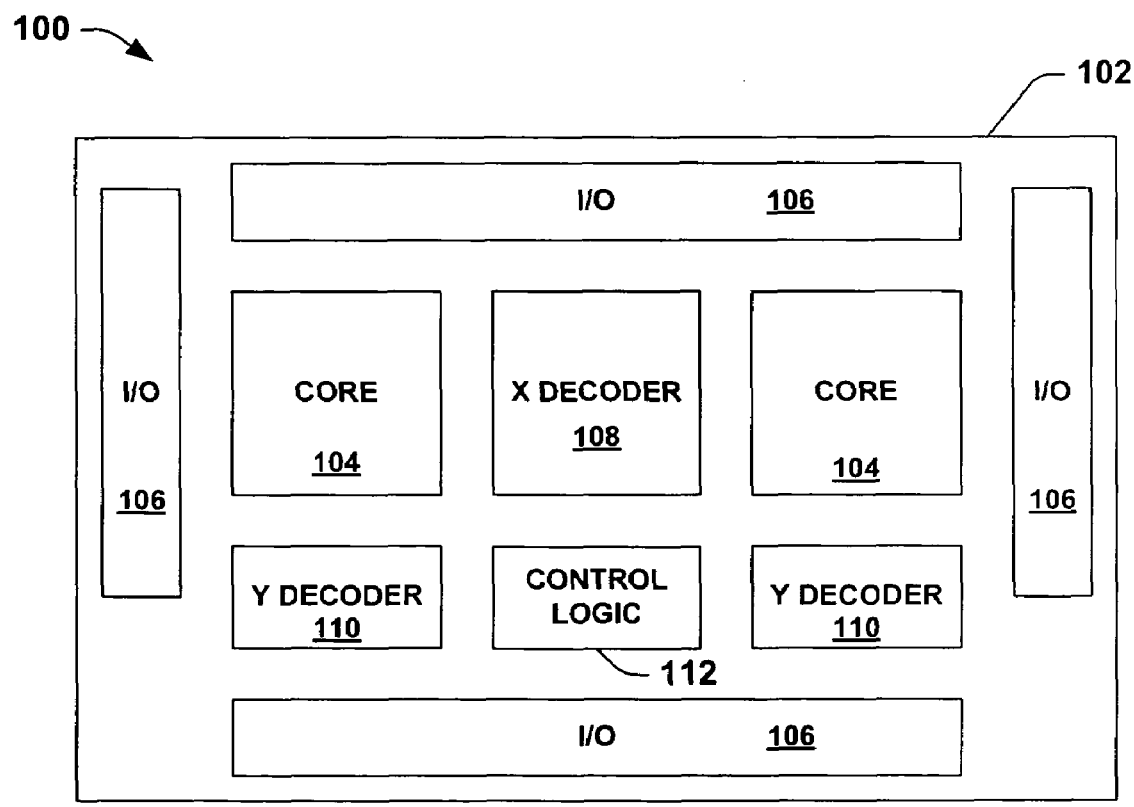
FIG. 2 is a block diagram illustrating an exemplary flash memory device capable of employing the fast write methods and devices of the present invention.

FIG. 2 is a schematic diagram illustrating a top view of an exemplary dual-bit flash memory device 100 in accordance with an aspect of the present invention. The memory 100 generally includes a semiconductor body 102 containing one or more high-density core regions 104 in which the dual-bit flash memory cells reside. The high-density core regions typically include one or more M by N arrays 104 of individually addressable, substantially identical dual-bit flash memory cells. Within such arrays 104, the memory may be further subdivided into smaller memory cell array portions, such as a plurality of sectors, however, any configuration of such cells is contemplated by the present invention. Elsewhere on the device, lower-density peripheral portions reside, and typically include input/output (I/O) circuitry 106 and programming circuitry for selectively addressing the individual memory cells. The programming circuitry is represented in part by and includes one or more x-decoders 108 and one or more y-decoders 110 that cooperate with the I/O circuitry 106 and control logic circuitry 112 for selectively connecting a source, gate, and/or drain of selected addressed memory cells to predetermined voltages or impedances to effect designated operations on the respective memory cells (e.g., programming, reading, and erasing, and deriving necessary voltages to effect such operations).

Figure 3:
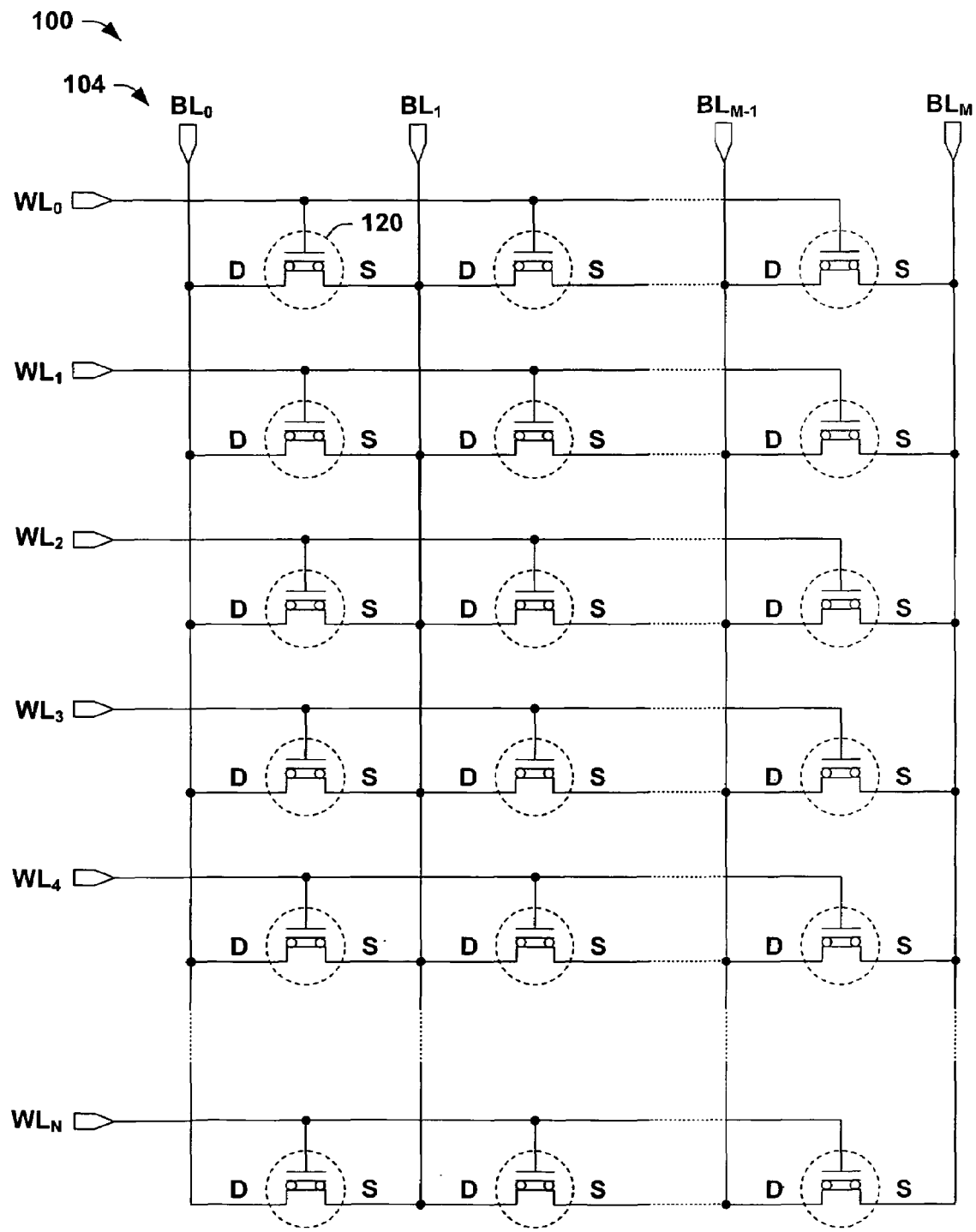
FIG. 3 is a schematic diagram illustrating a virtual ground type dual-bit flash memory architecture in which the fast write methods and devices of the present invention may be employed.

FIG. 3 illustrates an example of a portion of one of the core arrays 104 in the device 100, wherein portions of several rows and columns of cells are illustrated along word lines $WL_0$ through $WL_N$ and bit lines $BL_0$ through $BL_M$, respectively, where the array 104 is illustrated in a virtual ground configuration in this example. The array 104 comprises rows of dual-bit flash cells 120 with control gate terminals coupled to an associated word line WL, and with columns of cells 120 having a drain of one cell coupled to an associated bit line BL together with the source of an adjacent cell. In this configuration, the drain terminals of the cells 120 within a given column are connected to the same bit line BL.

Individual flash cells 120 may be selected via a corresponding word line WL and a pair of bit lines BL bounding the target cell, wherein the word line and bit line signals are generated by the control logic 112 and decoder circuitry 108, 110 (FIG. 2). Thus, when a positive voltage is applied to the bit line BL coupled to the drain of a cell 120, a conductive path is established between the drain and the source thereof, which is connected to ground by provision of the appropriate bit line signals from the control logic 112 and decoders 108, 110. In this manner, a virtual ground is formed by selectively connecting a ground to the bit line associated with the source terminal of only those selected flash cells which are to be programmed or read.

Figure 4:
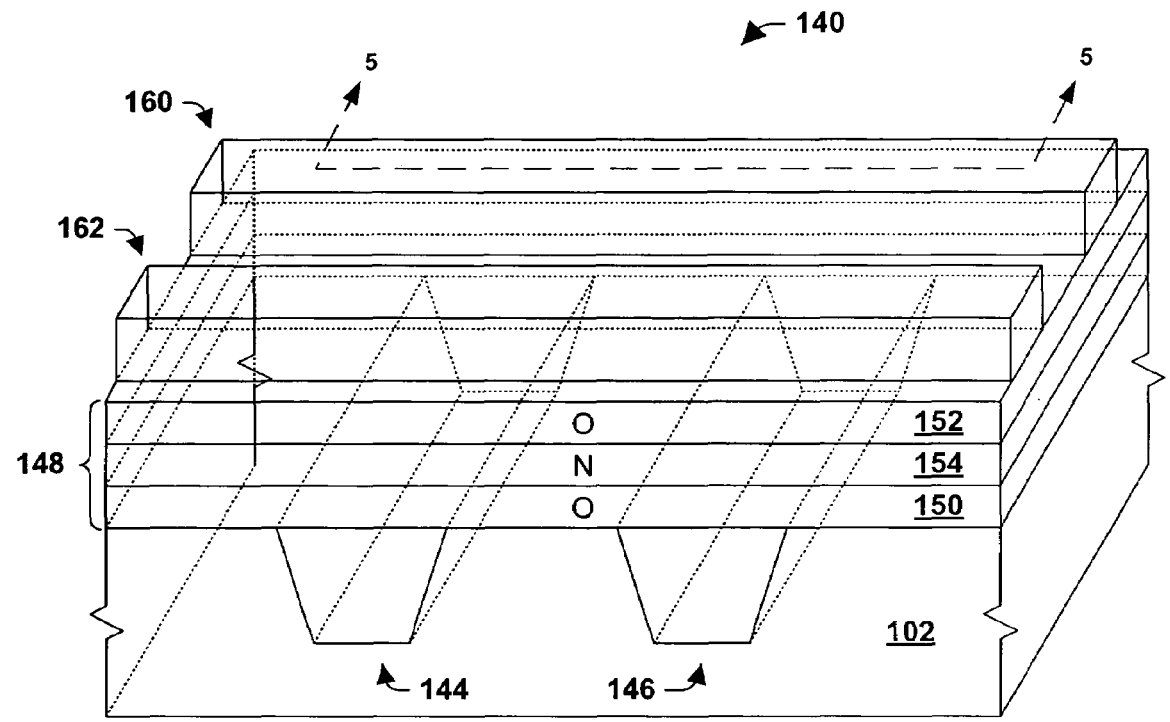
FIG. 4 is a fragmentary perspective view illustrating an exemplary layout of a few dual-bit flash memory cells in a virtual ground type architecture that may be employed in conjunction with the present invention.

Turning now to FIG. 4, a perspective view of a portion of a dual-bit flash memory array is provided illustrating several dual-bit cells 140 in an exemplary, simplified layout for a virtual ground architecture such as that illustrated in FIG. 3. The cells 140 comprise diffused or buried bit lines 144 and 146 that operate as source/drain regions within the semiconductor body 102. Overlying the body 102 is the charge trapping dielectric layer, for example, a tri-layer ONO 148 comprising a first oxide 150, a second oxide 152 and a nitride layer 154 sandwiched therebetween. Overlying the charge trapping dielectric 148 are patterned, doped polysilicon word lines 160, 162 running generally orthogonal to the buried bit lines 144, 146.

Figure 5:
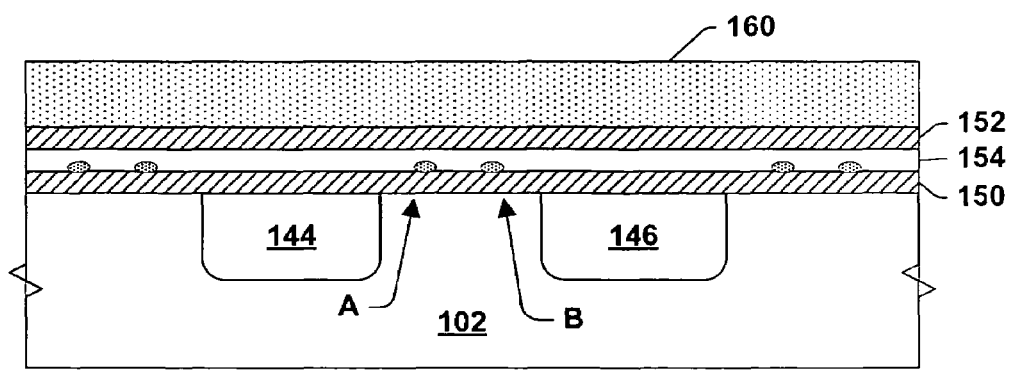
FIG. 5 is a fragmentary cross section taken along dotted line 5-5 of FIG. 4, illustrating dual-bit flash memory cells having both bit locations programmed to a state representing, for example, the logic state "0"

FIG. 5 is a fragmentary cross section of the dual-bit flash memory device of FIG. 4 taken along dotted line 5-5. In the example of FIG. 5 a patterned polysilicon word line (transistor gate(s)) extends laterally across a plurality of buried bit lines (source/drains) 144, 146 that extend into the page. Based on the biasing of the source/drain regions and the control gate, each of the cells along a word line may be erased, programmed or read, respectively. As illustrated in FIG. 5, the three partial dual-bit cells each have both first and second bit locations A and B at least partially programmed by the application of charge thereto. For example, by biasing bit line 144 to a positive drain potential, bit line 146 to a ground source potential, and the control gate to a sufficient program potential, electrons travel from the source 146 toward the drain 144. A certain number of such electrons have sufficient energy to overcome the energy barrier associated with the oxide insulator layer 150, and become injected into the charge trapping layer (e.g., mostly the nitride layer 154), which is a phenomenon known as hot carrier injection. Based on the magnitude and/or duration of the drain and control gate biasing, varying amounts of charge are injected into one bit location (e.g., bit location B identified in FIG. 5). If sufficient charge is injected into bit location B, the threshold voltage of the flash cell for that bit location is raised such that upon reading the cell, the bit location has changed from a first, erased or un-programmed state (e.g., a "1") to a second, programmed state (e.g., a "0).

Similarly, by switching the source/drain regions (e.g., biasing region 144 as the source and region 146 as the drain), charge can be injected into bit location A via hot carrier injection, wherein an amount of charge supplied thereto will ultimately determine the state associated with that bit location.

The time it takes to program a flash memory cell typically is measured by the time it takes to perform the programming of the bit, as well as the time necessary to perform any subsequent program verify operations. For example, after the programming of a bit to a desired state, a program verify operation is performed to verify whether the data bit is at the desired state. If not, then a programming pulse is re-applied thereto, followed by another program verify step. In conventional memory devices, the write or programming speed as defined by the total time required to perform the initial program operation followed by the average number of subsequent program verify iterations is not sufficiently fast to permit the use of flash memory in applications requiring fast write speeds.

The inventors of the present invention appreciated that the speed at which a first bit at a first bit location is programmed and the speed at which a corresponding second bit on the same transistor (e.g., at a second bit location) differs based on the programmed state of the first bit altering the electrical characteristics of the second bit location. In some cases, the altering of device performance of one bit by its corresponding second bit is referred to as complementary bit disturb (CBD), and is generally considered a problem to be avoided or eliminated. The inventors of the present invention appreciated that at least one aspect of the CBD phenomena can be exploited to provide dual-bit flash array portions that exhibit substantially faster write or programming speeds than conventional devices, for example, on the order of 4 or more times faster (e.g., 20-25% of the conventional write time of dual-bit flash or single bit NAND). The present invention achieves the above performance by block erasing a group of cells, that is, removing the charge from both bit locations of the cells to achieve a first state thereat. Subsequently, a first bit location of each cell in the group has charge supplied thereto so as to alter the electrical characteristics of each cell in the group. For example, sufficient charge may be provided so as to program the first bit location to a second state. Subsequently, programming operations may be made to the second bit locations of cells within the group, wherein such programming operations occur substantially faster than conventional cells due to its complementary bit having charge thereat. One performance trade-off is that the group of cells may only hold meaningful data in the second bit locations, thereby reducing the density within that array portion by half, however, the program speed to such cells is found to increase by about 4 or more times over conventional devices (e.g., achieving a write speed of above 30 Mbytes/sec).

Although the present invention discusses the term first and second bit locations as bit locations A and B, respectively, by means of example, it should be understood that the first and second bit locations may be interchanged such that the first bit location may be either the A bit or the B bit, and such variations are contemplated as falling within the scope of the present invention.

Figure 6:
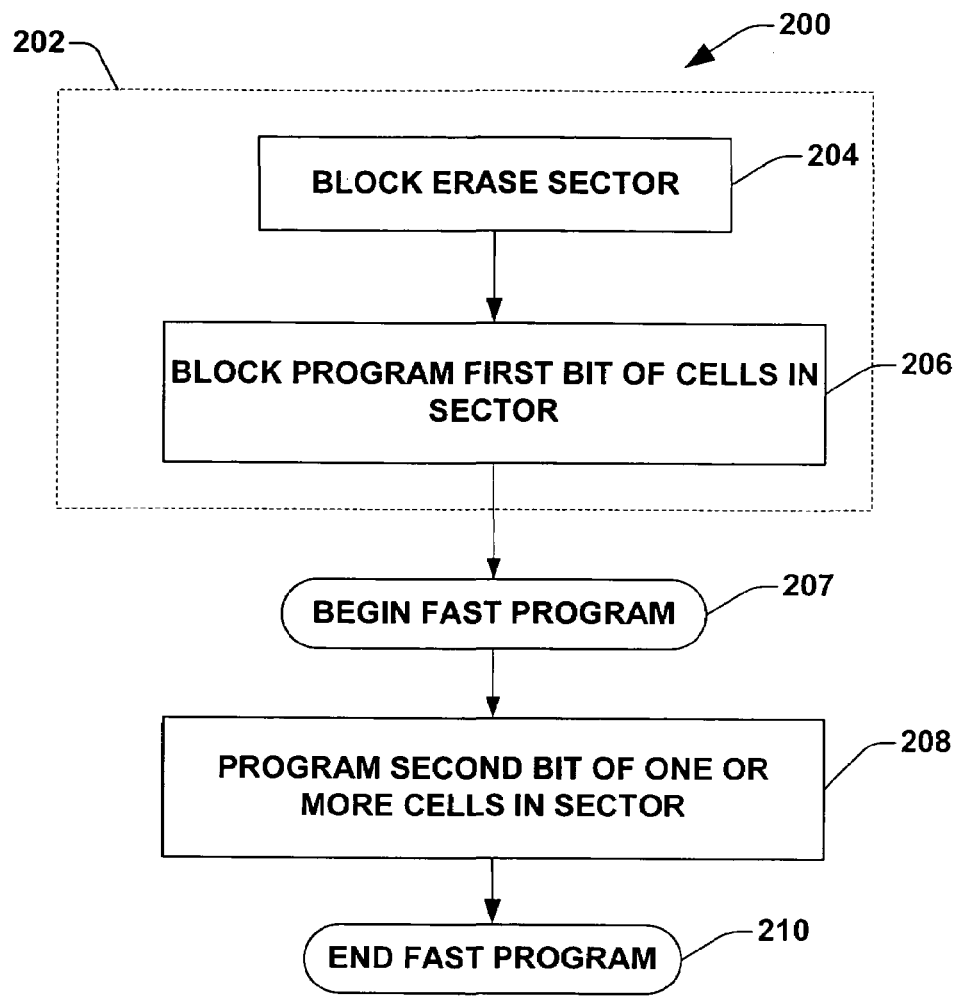
FIG. 6 is a flow chart diagram illustrating a method of performing a fast write block erase followed by a high-speed write according to one aspect of the present invention, wherein actions 204 and 206 describe, in one example, the fast-write block erase process.

Turning now to FIG. 6, a flow chart is provided illustrating a method 200 of setting up a dual-bit flash memory cell to facilitate high speed write performance and subsequently executing such fast programming in accordance with the present invention. The exemplary method 200 is hereinafter illustrated and described with respect to FIGS. 7-10, wherein the illustrated devices and structures at various stages of the method are not necessarily drawn to scale. Although the exemplary method 200 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Further, the methods according to the present invention may be implemented in association with the fabrication and/or processing of flash memory devices illustrated and described herein as well as in association with other structures and devices not illustrated.

Beginning at 202 a fast program set-up operation is initiated, wherein a block erase operation is performed on a selected portion of the dual-bit core cell memory at 204. In one example, the core memory is partitioned into a plurality of memory sectors, and such sectors may have differing sizes in accordance with the invention. In one example, the block erase operation serves to remove charge from both first and second bit locations of each dual-bit flash memory cell within the selected memory sector. For example, by biasing the source/drain regions appropriately via the associated bit lines and applying a negative potential to the gate electrode the charge that may be stored in one of the bit locations is extracted from the charge trapping layer and the threshold voltage associated therewith is lowered. Similarly, by swapping the source/drain regions and again applying the bias voltages, any charge stored in the second bit locations of the cells within the sector is removed therefrom, thereby lowering the threshold voltage associated therewith. Preferably, the block erase operation is sufficient to extract sufficient charge from both the first and second bit locations of each cell in the selected sector so as to establish a first state (e.g., an un-programmed state, a "1").

Figure 7:
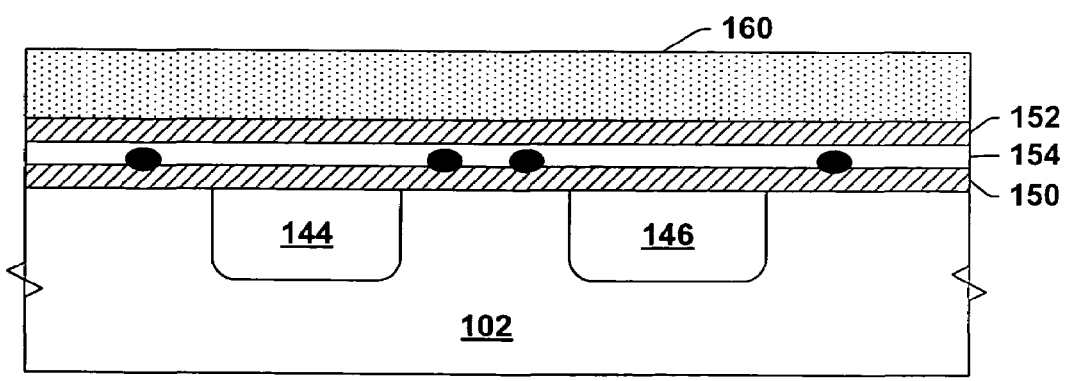
FIG. 7 is a fragmentary cross section diagram illustrating a plurality of dual-bit flash memory cells within a fast write array portion prior to a fast programming operation according to the present invention having a random distribution of data therein based on previous operations.
Figure 8:
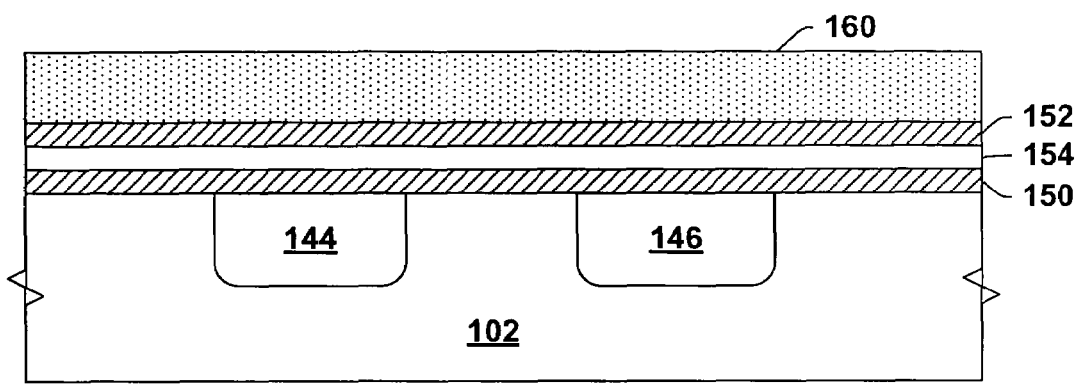
FIG. 8 is a fragmentary cross section diagram illustrating the plurality of dual-bit flash memory cells of FIG. 7 after a block erase step in accordance with the present invention.

Initially, an array portion may appear as illustrated in FIG. 7, wherein data within the dual-bit cells is generally random based on, for example, previous programming thereto. That is, some cells may have both bit locations programmed, and some cells may have both bit locations erased, while other cells may have either first or second bit location programmed. After the block erase operation of 204, the cells appear as illustrated in FIG. 8, wherein no charge is seen at the first and second bit locations A and B for each of the cells within the selected sector. Although FIG. 8 illustrates the locations as completely devoid of charge, it should be understood that some remnant charge may still reside at one or both of the first and second bit locations, and still fall within the scope of the present invention. Preferably, sufficient charge is extracted from both bit locations of each cell so as to be read as an un-programmed state.

The method 200 then continues at 206, wherein, in a second portion of the fast program set-up of 202, a block program operation is performed at the first bit location of each dual-bit cell within the selected sector. In one aspect of the present invention, the first bit location (e.g., bit location A) of each cell is programmed to a second, programmed state (e.g., a "0"). In an alternative aspect of the present invention, the block program of the first bit location at 206 may simply comprise supplying charge to each of the first bit locations, wherein the charge is not sufficient to alter the state at the first bit locations. It has been found that even a relatively small amount of charge in the first bit locations is sufficient to effectuate a substantial improvement in subsequent programming speed to the corresponding second bit locations.

Figure 9:
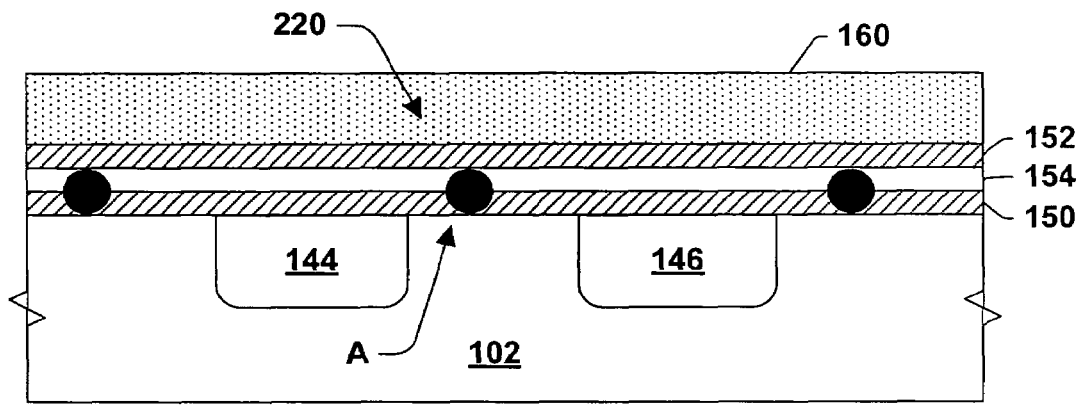
FIG. 9 is a fragmentary cross section diagram illustrating the plurality of dual-bit flash memory cells of FIG. 7 after a block program of a first bit location of the cells in the fast write array portion in accordance with the present invention, thereby illustrating a status of a fast-write cell at the end of the fast-write block erase process.
Figure 10:
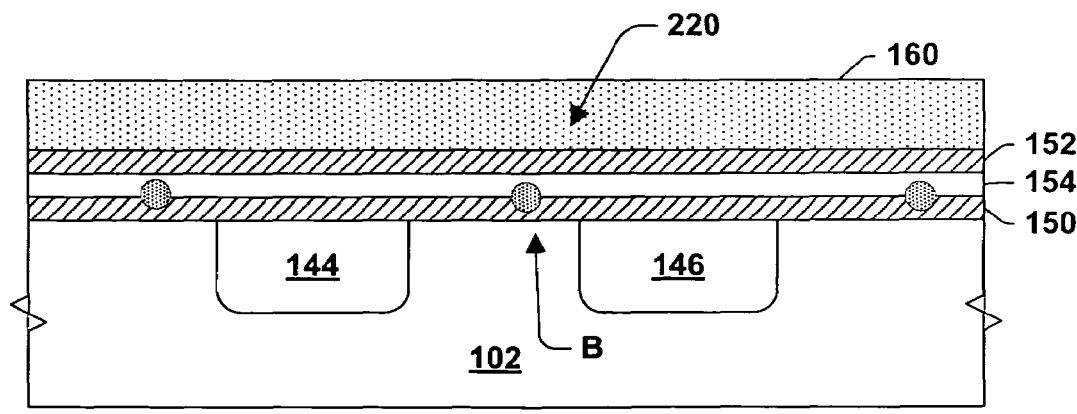
FIG. 10 is fragmentary cross section diagram illustrating the plurality of dual-bit flash memory cells of FIG. 7 after a programming of a second bit location of one or more of the cells in the fast write array portion in accordance with the present invention, wherein each bit may be in one of the two states based on the user's data.

The result of the block program of the first bit locations of the cells at 206 is illustrated in FIGS. 9 and 10, respectively. For example, in FIG. 9, first bit locations 220 (e.g., bit location A for each cell in the selected sector) is programmed with a substantial amount of charge that is illustrated as a relatively large area with dark hatching. Alternatively, in FIG. 10, first bit locations 220 are switched to correspond to bit location B to show that the invention is applicable to either case since the dual-bit cells operate symmetrically. In addition, FIG. 10 illustrates the case where a smaller amount of charge is supplied to the first bit locations and is thus represented by charge distributions that are slightly smaller and hatched less darkly. Therefore it should be appreciated that such variations are contemplated as falling within the scope of the present invention. It should be appreciated that the amount of charge is greater than an erased bit location. In that respect, the charge is sufficient to not correspond to the first (or erased) state, even though the charge may not be sufficient to make such bit location programmed to a second state that would correspond to a level where data would be read as a different state in the conventional sense.

Following the fast program set-up at 202, the actual fast program operation may be performed beginning at 207, wherein the programming of the second bit location in one or more of the cells within the sector is performed at 208. Such a fast program operation may include a programming operation immediately following the set-up of action 202, or may occur at some later time, as may be desired. In addition, the fast programming at 208 may occur with one or more of the cells within the sector, depending on the nature and quantity of the data to be saved thereat. The methodology 200 of FIG. 6 then concludes at 210.

It should be further appreciated that the method 200 of FIG. 6 may be limited to one or more sectors or other array portions within the entire core memory. That is, although the method 200 provides for a substantial improvement in write speed, it does reduce memory density in such sectors since each of the first bit locations in the cells within the fast write sector is unavailable for holding data; consequently, it may be desirable for only one or more sectors within the entire core memory to be dedicated to fast write operations while the remaining sectors may operate in conjunction with conventional programming techniques. Further, the amount of sectors so partitioned may be flexibly controllable to accommodate differing needs in the memory over time, or provide flexibility within a single chip to accommodating differing applications that require differing amounts of fast write memory and high-density (normal write speed) memory.

Figure 11:
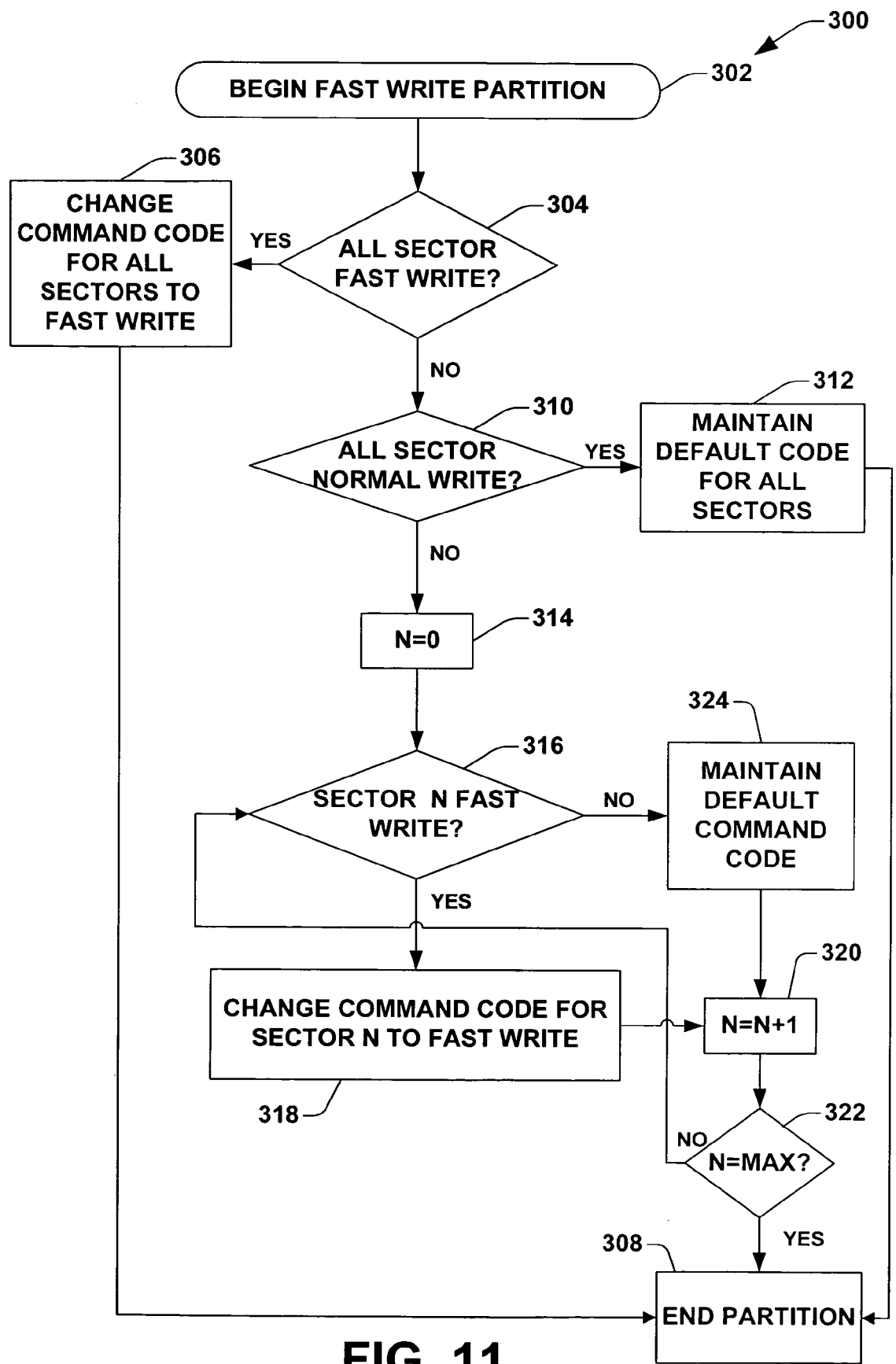
FIG. 11 is a flow chart diagram illustrating a method of partitioning a dual-bit flash memory into fast write array portions and normal array portions according to the present invention.

In accordance with another aspect of the present invention, a method 300 of partitioning a dual-bit flash memory into fast write portions and normal write portions is provided, as illustrated in FIG. 11. The method 300 begins at 302 and proceeds to query whether all sectors within the core array are to be treated as fast write array portions or sectors at 304. If the response to such a query is in the affirmative (YES at 304), then a command code for all the sectors within the core array are changed to a fast write at 306. In the above example, it is assumed that a default condition exists, wherein each of the sectors are initially set to a normal write operation mode. However, alternatives to this default condition are contemplated by the present invention. Upon the command code being set to fast write mode for each of the sectors at 306, the method 300 may conclude at 308 with an end of partitioning, and in subsequent operations control circuitry will access locations containing the command code(s) set at 306 for effectuating fast write operations.

If the conclusion to the query at 304 is in the negative (NO at 304), then the method proceeds to 310, wherein another query is made whether all the sectors within the core array are to be treated as normal write sectors. If the response thereto is in the affirmative (YES at 310), then the default command codes are maintained in their present condition at 312, for example, in a memory location. Again, action 312 assumes the default command code(s) are set to normal operations. If, however, a different default condition exists, then command codes may be changed, for example, as discussed above at 306. Upon action 312 being completed, the method 300 proceeds to 308, wherein partitioning is complete and control logic may then employ the command codes for setting up the core memory for subsequent writing (programming) thereto.

If the response to the query at 310 is negative (NO at 310), then a sector counter variable "N" is set to an initial value representing the first sector within the core array (e.g., N=0) at 314. A query is then made at 316 whether the particular sector (e.g., initially sector 0) is to be partitioned as a fast write sector. If the response to the query is in the affirmative (YES at 316) then the command code associated with the present sector N is changed to reflect that the sector is portioned as a fast write sector at 318. The sector counter variable N is then incremented at 320, followed by a query whether all the sectors have been evaluated by comparing the counter variable to a maximum threshold value at 322. If the response to the query at 322 is in the negative (NO at 322), then additional sectors still require evaluation and partitioning within the core array, and the method 300 proceeds to query 316 wherein the next sector is evaluated to determine whether it is to be set up as a fast write sector or a normal sector. If the response to the query at 316 is negative (NO at 316), then the sector at issue is maintained as a normal write type sector at 324, and the method proceeds to the next sector in the core array at actions 320 and 322, respectively.

It should be understood that the sector counter, in another example, may count down by initial setting to the last sector at 304 and decremented at 320, until the first record at 322, or any other counting method covering all the sectors of the dual-bit memory. Another option is defining a group (one or more) of sectors to be set as high-write speed sectors (e.g., at the beginning or at the end of the flash core array), and counting only the sectors in this group.

It should also be understood that maintaining such a sector table is optional, and other methods may be implemented to determine whether a sector is fast-write or normal. For example, the user may track the status of sector in his application, and may also use the sector status inquiry command to verify the mode of the data stored in any sector.

Figure 12:
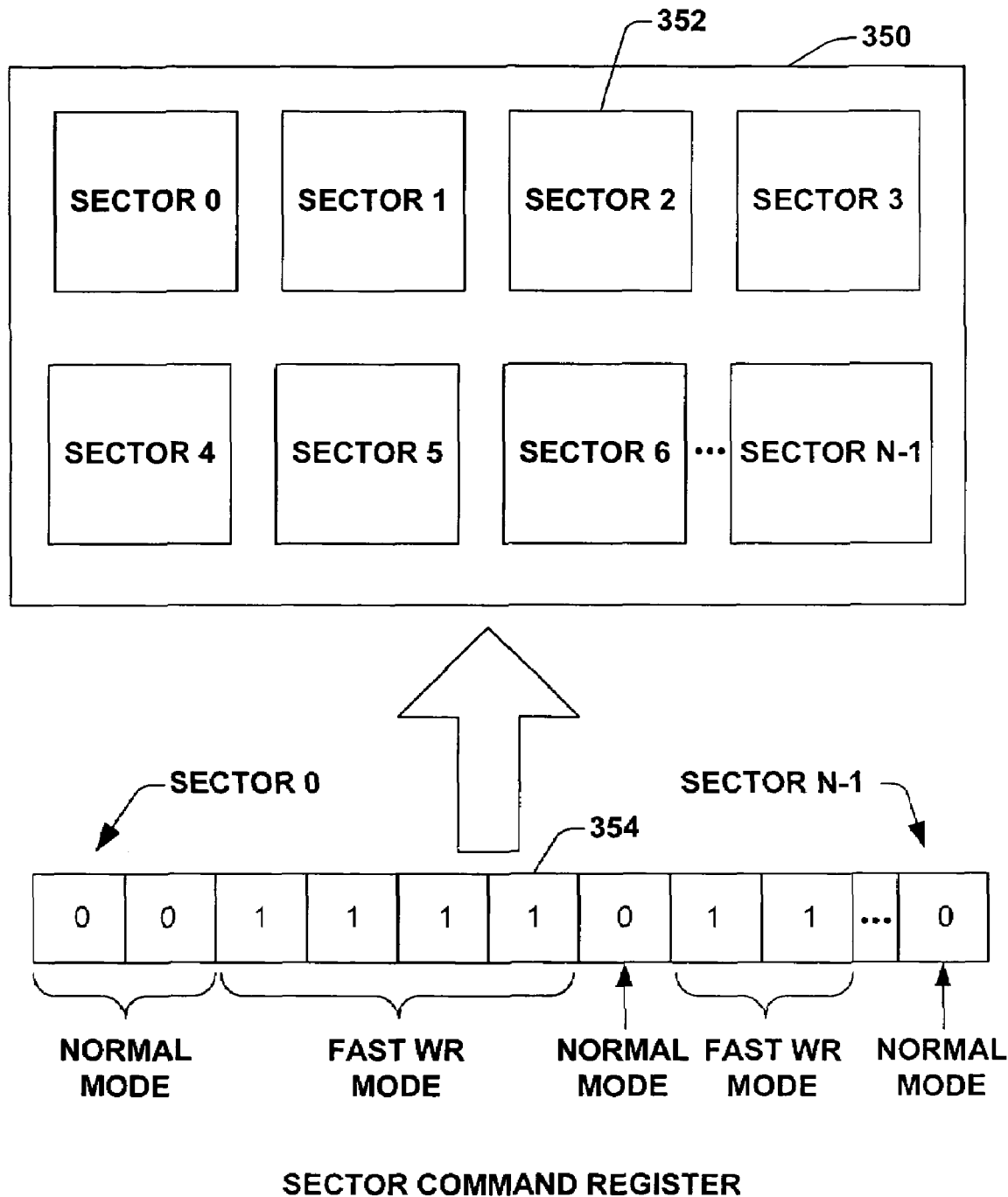
FIG. 12 is a schematic diagram illustrating a dual-bit flash memory array and command register for partitioning the flash memory array into fast write array portions and normal array portions, respectively.

A schematic diagram illustrating, in one example, how the methodology 300 of FIG. 11 may be carried out is illustrated in FIG. 12. In FIG. 12, a core cell array 350 is partitioned into N sectors 352, numbered as sectors 0–(N−1). As stated previously, although the partitioning of the present invention may be carried out in sectors, it should be understood other array portion sizes may be employed, and that such array portions themselves may vary in size, and any such variation is contemplated as falling within the scope of the present invention. A memory location on or associated with the dual-bit flash memory, such as a sector command register 354 has a plurality of data locations that correspond generally to the sectors within the core array 350. As the partitioning is performed in accordance with the method 300 of FIG. 11, or in accordance with another partitioning scheme, data associated with whether the sector will be employed as a fast write sector or as a normal write sector is saved in the corresponding data location. In the example of FIG. 12, a single data bit is employed, wherein a "0" corresponds to a desired normal write mode while a "1" corresponds to a desired fast write mode for a given sector corresponding to that data location. Such data may then be accessed and employed by control circuitry in the subsequent set up and execution of various program and erase operations, for example.

The present invention is also directed to a dual-bit flash memory device having a core cell array and a control circuit configured to operate in accordance with the operation principles described herein. For example, in one aspect of the invention, a control circuit is provided that operates to partition the plurality of array portions (e.g., sectors) within the core array into one of fast write array portions and normal write array portions, respectively. In another aspect of the invention, a control circuit is provided that operates to facilitate fast write operations in selected memory portions by block erasing such array portions in two phases, wherein both bit locations are erased (e.g., charge removed therefrom) in a first phase, and first bit locations are programmed (e.g., charge supplied thereto) in a second phase. Subsequently, write operations are performed to second bit locations in one or more cells within the selected array portions, wherein such write operations are accomplished in about 20-25% of the time required in traditional write operations due to the deliberate presence of charge in the complementary bit (first bit) location. The short write time equals to fast write speed of 4 or more times faster than normal write speed of dual-bit flash or single-bit NAND flash.

Figure 13:
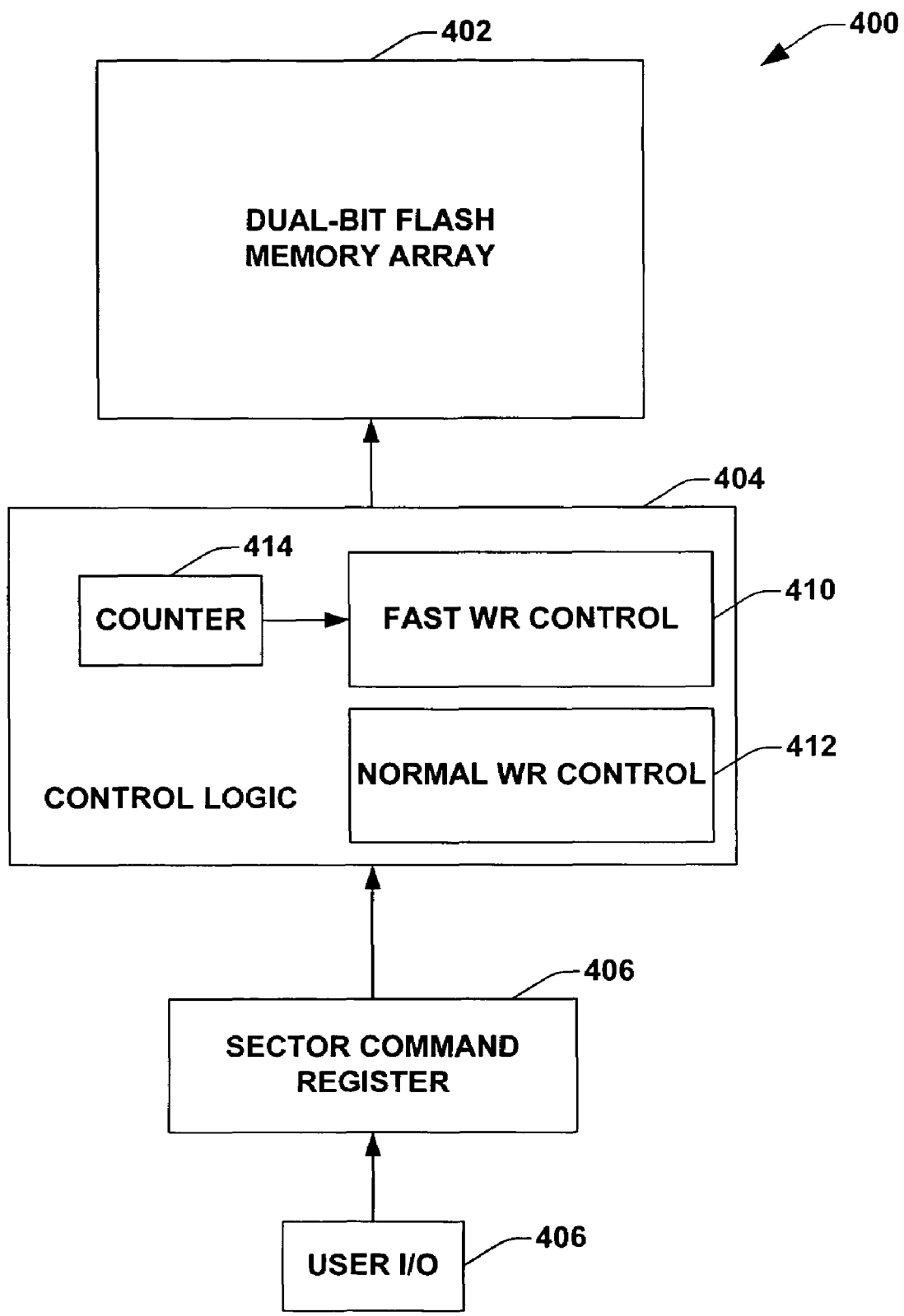
FIG. 13 is a schematic block diagram illustrating a dual-bit flash memory device having control logic configured to partition and operate the device in accordance with a fast write operation procedure of the present invention.

Turning now to FIG. 13, a dual-bit memory device 400 is provided, and comprises a dual-bit flash memory array 402 that is configured into a plurality of array portions such as sectors. A control circuit 404 is coupled to the memory array 402 and via support circuitry such as X and Y decoders (not shown) provides control and data signals for various operations (e.g., erase, program and read operations) to the dual-bit flash cells within the array. The device 400 further comprises a sector command register or other type data location 406 that contains data corresponding generally to the various array portions within the core array 402. The data is indicative of whether such array portions will operate in a fast write mode or in a normal write mode, and are accessed by the control circuit 404 to effectuate the unique operations associated therewith. Lastly, the memory device 400 includes a user interface 408 that may be employed to facilitate a flexible partitioning of the core array into fast write mode and normal write mode portions, respectively.

The control logic 404 comprises a fast write control circuit 410 and a normal write control circuit 412, respectively, that are employed to provide control for various operations to the flash array 402 based on whether the array portion or sector at issue has been designated as a fast write array portion or a normal write array portion. Based on data provided to the control circuit 404 from the sector command register 406, the control circuit employs one of the write control circuits 410, 412 to effectuate the desired operation. As may be appreciated the write control circuits 410 and 412 may comprise separate pieces of hardware or may be integrated into a single state machine, as may be desired, or may even be provided via firmware, and any such many of providing such control functionality is contemplated as falling within the scope of the present invention.

In the instances of a sector being designated as a fast write type sector, the control circuit 404, in one example, conditions that sector for fast writing thereto. In one example, the circuit 404 employs fast write control circuitry 410 to execute an operation similar to that described above in actions 204-206 of FIG. 6. That is, the selected sector is initially block erased, wherein both bit locations of each dual-bit cell within the sector have sufficient charge removed therefrom so as to achieve a first, un-programmed state (e.g., a "1"). The fast write control circuit 410 then programs the "don't care" or complementary bit of each cell within the selected sector. As discussed supra, in one example, the first bit location (e.g., bit location A) of each cell within the fast write sector is programmed. In one example, the programming thereof is sufficient to change the state of the complementary bit (bit location A) to a second state (e.g., a "0"). Alternatively, a lesser amount of charge may be supplied to the complementary bit (e.g., the first bit location) such that the bit may not actually change state. It has been found that even small amounts of charge in the complementary bit advantageously increase a programming speed to the second bit location within each cell of the selected sector.

With the above fast write control circuitry operation, the fast write sector or sectors are configured for subsequent fast programming thereto. In such instances, the fast write control circuit 410 is further configured to provide control signals to provide the transfer of data to the second bit locations of the cells within the selected sector or sectors at a substantially high data rate. In one example, the control signals to the cells, the drain bias pulse and gate bias pulse, may be shorter duration pulses to thereby increase the data transfer rate thereto. In addition, it has been found that the program verify circuitry, although it may be the same as that employed in a normal write array, is utilized fewer times to effectuate the data transfer. That is, instead of the program verify and re-program steps being repeated on average 4-5 times, whereas due to the programming of the complementary bit of the present invention, the program verify and re-program steps are repeated on average about once. Consequently, the total time (even if the programming pulse durations at the drains and gates are not reduced) needed to complete the programming is substantially reduced.

Note that since programming in the fast write sectors is directed to only the second bit locations, the programming state machine will differ from that employed within the normal write sector array control circuit 412. In addition, since meaningful data resides only at the second bit location, the read state machine circuitry within the fast write control circuit 410 will differ from that in the normal write sector control circuit 412. Further, as discussed previously, although in most examples provided herein, the first bit location referred to the A bit location of the dual-bit cell, it should be understood that the first bit location may alternatively refer to the B bit location, as may be desired, since the dual-bit flash memory cells are symmetrical. Lastly, since the fast write mode uses only one of the bit locations for data retention, a counter 414 may further be employed in conjunction with the control circuit 404 to count the number of operations performed to the fast write sectors, and provide a changeover, wherein the first bit locations change from the A bit to the B bit or vice-versa after a predetermined number of operation cycles in order for operational cycling effects to be experienced generally evenly at both bit locations in the cell. Further still, such a changeover may be repeated at other predetermined times such that the first bit locations swap back and forth between the A and B bit locations throughout the life of the memory device without a counter, as may be desired.

In any event, the operational control in which block erase operations, program operations and read operations are performed via the fast write and normal write control circuits 410 and 412 differ from one another.

In addition, the control circuit 404 is configured to optionally transfer data between fast write array portions (relatively low density memory regions) and normal write array portions (relatively high density memory regions), as may be desired, in a single transfer command or any combination of commands (e.g., read one page or more of the fast-write portion and write it to one page or more in the normal portion of the same flash device or another one). The amount of transferred data may be variable. Although the invention has been described as related to dual-bit flash in the above examples, it is valid for any number of multi-bit flash with at least two physical bits per cell, where programming of the first bit (or bits) results in a faster write speed of the other bit (or bits) in the same memory cell, and all such variations are contemplated by the present invention.

Although in the above examples, the pre-programming or pre-conditioning of a cell group is performed in a fast program set-up mode that included a block erase of cells, the present invention contemplates other variations. For example, a group of cells can be block erased so that each bit of the multi-bit cells are programmed to a given state (e.g., charge removed therefrom). Then, a fast program set-up is performed later, in association with a programming operation. In such case, when a given cell is to be programmed, a first bit is initially charged in a pre-programming or pre-conditioning step, followed by programming of a second bit in the multi-bit cell. In the above manner, the programming of the second bit is still faster than conventional cells that have not been conditioned as discussed (e.g., about 2-3 times faster).

In addition, while many of the above examples are provided in the context of a dual bit memory cell, the invention contemplates multi-bit cells having greater than two bits. For example, a four-bit or eight-bit cell may be employed in accordance with the present invention. In such an instance, one bit of the cell may be charged to some extent after cell erasure to facilitate a fast write to one or more of the remaining bits of that cell. Alternatively, more than one bit may be charge to some extent after erasure of the cell in order to facilitate a fast write to one or the remaining bits of that cell. All such permutations are contemplated as falling within the scope of the present invention.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A method of partitioning a multi-bit flash memory array into a fast write portion and a normal write portion, comprising:
   identifying an array portion of dual-bit flash memory cells for fast write operations thereto; and
   performing a fast write enabling erase operation on the identified fast write array portion prior to a write operation thereto, wherein the fast write enabling erase operation differs from an erase operation to be performed on another array portion comprising a normal write array portion of memory cells that is not identified for fast write operations thereto.

2. The method of claim 1, wherein performing the fast write enabling erase operation comprises:
   erasing both first and second bit locations for each cell in the identified fast write array portion; and
   supplying charge to the first bit location for each cell in the identified fast write array portion, wherein the supplied charge to the first bit locations is unrelated to user data, thereby providing for subsequent fast write operations to the second bit locations of each cell therein.

3. The method of claim 2, wherein erasing both first and second bit locations comprises removing sufficient charge from both bit locations so as to be read as each bit in the identified fast write array portion residing at a first state.

4. The method of claim 3, wherein supplying charge to the first bit location comprises supplying sufficient charge thereto so as to achieve a subsequent write operation to the second bit location of each cell in the identified fast write array portion less than a predetermined time period.

5. The method of claim 3, wherein supplying charge to the first bit location comprises supplying sufficient charge thereto so as to be read as each first bit location in the identified fast write array portion residing at a second state.

6. The method of claim 1, wherein identifying the fast write array portion comprises:
   loading a command register with a value indicative of a fast write mode at a location within the command register associated with the identified fast write array portion; or
   setting the flash memory array in a "fast write mode", where all following commands will be considered relating to fast-write portions.

7. The method of claim 6, further comprising performing an erase of the multi-bit flash memory array, wherein performing the erase comprises:
   identifying a portion of the memory array to be erased;
   evaluating a mode of the command register at a location therein associated with the identified array portion to be erased; and
   performing either the fast write erase operation or a normal erase operation that differs from the fast write erase operation on the identified array portion based on the evaluation.

8. The method of claim 1, wherein the array portion comprises a plurality of memory blocks that are not physically continuous with respect to one another.

* * * * *